US011263940B2

(12) United States Patent
Wang et al.

(10) Patent No.: US 11,263,940 B2
(45) Date of Patent: Mar. 1, 2022

(54) SHIFT REGISTER UNIT, DRIVING METHOD THEREOF, GATE DRIVE CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Ying Wang, Beijing (CN); Li Sun, Beijing (CN); Fengjing Tang, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 859 days.

(21) Appl. No.: 16/074,369

(22) PCT Filed: Jan. 26, 2018

(86) PCT No.: PCT/CN2018/074240
§ 371 (c)(1),
(2) Date: Jul. 31, 2018

(87) PCT Pub. No.: WO2019/010956
PCT Pub. Date: Jan. 17, 2019

(65) Prior Publication Data
US 2021/0272491 A1    Sep. 2, 2021

(30) Foreign Application Priority Data
Jul. 10, 2017 (CN) .......................... 201710556894.6

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2300/0426; G09G 2310/0267; G09G 2310/0286; G09G 2310/08; G11C 19/28
See application file for complete search history.

(56) References Cited

U.S. PATENT DOCUMENTS 8,816,728 B2    8/2014  Yoon et al.
9,343,030 B2    5/2016  Kim et al.
(Continued)

FOREIGN PATENT DOCUMENTS

CN    102110406 A    6/2011
CN    103208262 A    7/2013
(Continued)

OTHER PUBLICATIONS

The First Chinese Office Action dated Dec. 23, 2019; Appln. No. 201710556894.6.

*Primary Examiner* — Sejoon Ahn

(57) ABSTRACT

A shift register unit, a driving method thereof, a gate drive circuit and a display device are provided. The shift register unit includes: an input circuit, an output circuit, a pull-down control circuit and a pull-down circuit; and the output circuit is connected to a first DC power supply terminal, a second clock signal terminal, a pull-up node, a first driving signal output terminal and a second driving signal output terminal respectively, and is configured to output a first power supply signal of the first DC power supply terminal to the first
(Continued)

driving signal output terminal under control of the pull-up node.

20 Claims, 12 Drawing Sheets

(52) U.S. Cl.
CPC .............. *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 9,898,958 | B2 | 2/2018 | Ma |
| 2010/0177082 | A1 | 7/2010 | Joo et al. |
| 2018/0144811 | A1 | 5/2018 | Han et al. |
| 2019/0221181 | A1 | 7/2019 | Li et al. |
| 2019/0248560 | A1* | 8/2019 | Kim .................... B65D 81/022 |
| 2019/0250461 | A1* | 8/2019 | Andreev ................ G09G 3/20 |
| 2019/0251886 | A1* | 8/2019 | Wu ...................... G09G 3/2096 |
| 2019/0251887 | A1* | 8/2019 | Xue .................... G09G 3/3677 |

FOREIGN PATENT DOCUMENTS

| | | |
|---|---|---|
| CN | 104282279 A | 1/2015 |
| CN | 105957556 A | 9/2016 |
| CN | 106023943 A | 10/2016 |
| CN | 106887217 A | 6/2017 |

* cited by examiner

A charging phase: the first clock signal terminal CLK1 outputting the first clock signal, the input signal terminal STU outputting the input signal, and the input circuit 10 outputting the input signal to the pull-up node under the control of the first clock signal.

101

An output phase: the second clock signal terminal CLK2 outputting the second clock signal, the first DC power supply terminal VDD outputting the first power supply signal, the pull-up node PU maintaining the electric potential of the input signal, and the output circuit 20 outputting the second clock signal to the second driving signal output terminal and outputting the first power supply signal to the first driving signal output terminal OUT, under the control of the pull-up node.

102

A noise reduction phase: the third clock signal terminal CLK3 outputting the third clock signal, the second DC power supply terminal VH outputting the second power supply signal, the pull-down control circuit 30 outputting the second power supply signal to the pull-down node PD under the control of the third clock signal, and the pull-down circuit 40 outputting the third power supply signal of the third DC power supply terminal VSSL to the pull-up node PU, and outputting the fourth power supply signal of the fourth DC power supply terminal VSS to the second driving signal output terminal CA and the first driving signal output terminal OUT respectively, under the control of the pull-down node PD.

SHIFT REGISTER UNIT, DRIVING METHOD THEREOF, GATE DRIVE CIRCUIT AND DISPLAY DEVICE

The application claims priority to the Chinese patent application No. 201710556894.6, filed on Jul. 10, 2017, the entire disclosure of which is incorporated herein by reference as part of the present application.

TECHNICAL FIELD

The embodiments of the present disclosure relate to a shift register unit, a driving method thereof, a gate drive circuit and a display device.

BACKGROUND

When display devices display an image, shift registers (i.e., gate drive circuits) are needed to scan the pixel units. A shift register generally comprises a plurality of cascaded shift register units. For example, each shift register unit corresponds to one row of pixel units. It is implemented by the plurality of cascaded shift register units that each row of pixel units in the display device is progressive scanned and driven to display images.

SUMMARY

At least one embodiment of the present disclosure provides a shift register unit, comprising: an input circuit, an output circuit, a pull-down control circuit and a pull-down circuit.

The input circuit is connected to a first clock signal terminal, an input signal terminal and a pull-up node respectively, and is configured to control an electric potential of the pull-up node under control of a first clock signal of the first clock signal terminal and an input signal of the input signal terminal.

The output circuit is connected to a first DC power supply terminal, a second clock signal terminal, the pull-up node, a first driving signal output terminal and a second driving signal output terminal respectively, and is configured to output a first power supply signal of the first DC power supply terminal to the first driving signal output terminal, and output a second clock signal of the second clock signal terminal to the second driving signal output terminal, under control of the pull-up node.

The pull-down control circuit is connected to a third clock signal terminal, a second DC power supply terminal, a third DC power supply terminal, a pull-down node and the pull-up node respectively, and is configured to control an electric potential of the pull-down node under control of the pull-up node, a third clock signal of the third clock signal terminal, a second power supply signal of the second DC power supply terminal and a third power supply signal of the third DC power supply terminal.

The pull-down circuit is connected to the pull-down node, the third DC power supply terminal, a fourth DC power supply terminal, the pull-up node, the first driving signal output terminal and the second driving signal output terminal respectively, and is configured, under control of the pull-down node, to control electric potentials of the pull-up node, the first driving signal output terminal and the second driving signal output terminal through the third power supply signal and a fourth power supply signal of the fourth DC power supply terminal.

For example, in the shift register unit provided by an embodiment of the present disclosure, the output circuit comprises a first transistor, a second transistor and a capacitor. A gate electrode of the first transistor is connected to the pull-up node, a first electrode of the first transistor is connected to the first DC power supply terminal, and a second electrode of the first transistor is connected to the first driving signal output terminal; a gate electrode of the second transistor is connected to the pull-up node, a first electrode of the second transistor is connected to the second clock signal terminal, and a second electrode of the second transistor is connected to the second driving signal output terminal; and a first electrode of the capacitor is connected to the pull-up node, and a second electrode of the capacitor is connected to the second driving signal output terminal.

For example, in the shift register unit provided by an embodiment of the present disclosure, the pull-down control circuit comprises a third transistor and a fourth transistor. A gate electrode of the third transistor is connected to the third clock signal terminal, a first electrode of the third transistor is connected to the second DC power supply terminal, and a second electrode of the third transistor is connected to the pull-down node; and a gate electrode of the fourth transistor is connected to the pull-up node, a first electrode of the fourth transistor is connected to the third DC power supply terminal, and a second electrode of the fourth transistor is connected to the pull-down node.

For example, in the shift register unit provided by an embodiment of the present disclosure, the pull-down circuit comprises a fifth transistor, a sixth transistor and a seventh transistor. A gate electrode of the fifth transistor is connected to the pull-down node, a first electrode of the fifth transistor is connected to the fourth DC power supply terminal, and a second electrode of the fifth transistor is connected to the second driving signal output terminal; a gate electrode of the sixth transistor is connected to the pull-down node, a first electrode of the sixth transistor is connected to the fourth DC power supply terminal, and a second electrode of the sixth transistor is connected to the first driving signal output terminal; and a gate electrode of the seventh transistor is connected to the pull-down node, a first electrode of the seventh transistor is connected to the third DC power supply terminal, and a second electrode of the seventh transistor is connected to the pull-up node.

For example, in the shift register unit provided by an embodiment of the present disclosure, the pull-down circuit further comprises an eighth transistor. A gate electrode of the eighth transistor is connected to the third clock signal terminal, a first electrode of the eighth transistor is connected to the fourth DC power supply terminal, and a second electrode of the eighth transistor is connected to the pull-up node.

For example, in the shift register unit provided by an embodiment of the present disclosure, the input circuit comprises a ninth transistor. A gate electrode of the ninth transistor is connected to the first clock signal terminal, a first electrode of the ninth transistor is connected to the input signal terminal, and a second electrode of the ninth transistor is connected to the pull-up node.

For example, the shift register unit provided by an embodiment of the present disclosure further comprises an output control circuit, and the output control circuit is connected to the pull-up node, the second clock signal terminal and the second electrode of the ninth transistor respectively, and is configured to electrically connect the second clock signal terminal to the second electrode of the ninth transistor under control of the pull-up node. The input circuit further comprises an eleventh transistor, a gate electrode of the eleventh transistor is connected to the first clock signal terminal, a first electrode of the eleventh transistor is connected to the second electrode of the ninth transistor, and a second electrode of the eleventh transistor is connected to the pull-up node.

For example, in the shift register unit provided by an embodiment of the present disclosure, the output control circuit comprises a tenth transistor. A gate electrode of the tenth transistor is connected to the pull-up node, a first electrode of the tenth transistor is connected to the second clock signal terminal, and a second electrode of the tenth transistor is connected to the second electrode of the ninth transistor.

For example, the shift register unit provided by an embodiment of the present disclosure further comprises an output control circuit, and the output control circuit is connected to the pull-up node, the second clock signal terminal and the second electrode of the seventh transistor respectively, and is configured to electrically connect the second clock signal terminal to the second electrode of the seventh transistor under control of the pull-up node. The pull-down circuit further comprises a twelfth transistor, a gate electrode of the twelfth transistor is connected to the pull-down node, a first electrode of the twelfth transistor is connected to the second electrode of the seventh transistor, and a second electrode of the twelfth transistor is connected to the pull-up node.

For example, in the shift register unit provided by an embodiment of the present disclosure, the output control circuit comprises a tenth transistor. A gate electrode of the tenth transistor is connected to the pull-up node, a first electrode of the tenth transistor is connected to the second clock signal terminal, and a second electrode of the tenth transistor is connected to the second electrode of the ninth transistor.

For example, in the shift register unit provided by an embodiment of the present disclosure, the pull-down circuit further comprises a twelfth transistor. A gate electrode of the twelfth transistor is connected to the pull-down node, a first electrode of the twelfth transistor is connected to the second electrode of the seventh transistor, and a second electrode of the twelfth transistor is connected to the pull-up node. The input circuit comprises a ninth transistor and an eleventh transistor. A gate electrode of the ninth transistor is connected to the first clock signal terminal, a first electrode of the ninth transistor is connected to the input signal terminal, and a second electrode of the ninth transistor is connected to a first electrode of the eleventh transistor; and a gate electrode of the eleventh transistor is connected to the first clock signal terminal, and a second electrode of the eleventh transistor is connected to the pull-up node. The shift register unit further comprises an output control circuit, and the output control circuit is connected to the pull-up node, the second clock signal terminal, the second electrode of the ninth transistor and the second electrode of seventh transistor respectively, and is configured to electrically connect the second clock signal terminal to both the second electrode of the ninth transistor and the second electrode of the seventh transistor under control of the pull-up node.

For example, in the shift register unit provided by an embodiment of the present disclosure, the output control circuit comprises a tenth transistor. A gate electrode of the tenth transistor is connected to the pull-up node, a first electrode of the tenth transistor is connected to the second clock signal terminal, and a second electrode of the tenth transistor is connected to the first electrode of the twelfth transistor and the first electrode of the eleventh transistor.

For example, in the shift register unit provided by an embodiment of the present disclosure, the first DC power supply terminal is electrically connected to the second DC power supply terminal.

For example, in the shift register unit provided by an embodiment of the present disclosure, the third DC power supply terminal is electrically connected to the fourth DC power supply terminal.

For example, in the shift register unit provided by an embodiment of the present disclosure, the transistors are N-type transistors.

At least one embodiment of the present disclosure further provides a driving method of a shift register unit, comprising:

a charging phase: the first clock signal terminal outputting the first clock signal, the input signal terminal outputting the input signal, and the input circuit outputting the input signal to the pull-up node under control of the first clock signal;

an output phase: the second clock signal terminal outputting the second clock signal, the first DC power supply terminal outputting the first power supply signal, the pull-up node maintaining the electric potential of the input signal, and the output circuit outputting the second clock signal to the second driving signal output terminal and outputting the first power supply signal to the first driving signal output terminal, under control of the pull-up node; and a noise reduction phase: the third clock signal terminal outputting the third clock signal, the second DC power supply terminal outputting the second power supply signal, the pull-down control circuit outputting the second power supply signal to the pull-down node under control of the third clock signal, and the pull-down circuit, under control of the pull-down node, outputting the third power supply signal of the third DC power supply terminal to the pull-up node, and outputting the fourth power supply signal of the fourth DC power supply terminal to the second driving signal output terminal and the first driving signal output terminal respectively.

For example, in the driving method provided by an embodiment of the present disclosure, the output circuit comprises a first transistor, a second transistor and a capacitor. During the output phase, the second clock signal is at a first electric potential, the capacitor controls the electric potential of the pull-up node and drives the first transistor and the second transistor to be turned on, the second clock signal terminal outputs the second clock signal to the second driving signal output terminal, and the first DC power supply terminal outputs the first power supply signal to the first driving signal output terminal.

For example, in the driving method provided by an embodiment of the present disclosure, the transistors are N-type transistors, both the first power supply signal and the second power supply signal are at the first electric potential, and both the third power supply signal and the fourth power supply signal are at a second electric potential. The first clock signal is at the first electric potential during the charging phase and is at the second electric potential during the output phase and the noise reduction phase: the second clock signal is at the first electric potential during the output phase and is at the second electric potential during the charging phase and the noise reduction phase; the third clock signal is at the first electric potential during the noise reduction phase and is at the second electric potential during the output phase and the charging phase; and the first electric potential is a high electric potential relative to the second electric potential.

At least one embodiment of the present disclosure also provides a gate drive circuit, comprising a plurality of cascaded shift register units provided by the embodiments of the present disclosure.

For example, in the gate drive circuit provided by an embodiment of the present disclosure, the input signal terminal of each shift register unit is connected to the second driving signal output terminal of the previous shift register unit expect the first shift register unit.

At least one embodiment of the present disclosure also provides a display device, comprising the gate drive circuit provided by the embodiments of the present disclosure.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

FIG. 6 is a flowchart of a driving method of a shift register unit provided by an embodiment of the present disclosure;

DETAILED DESCRIPTION

Figure 1:
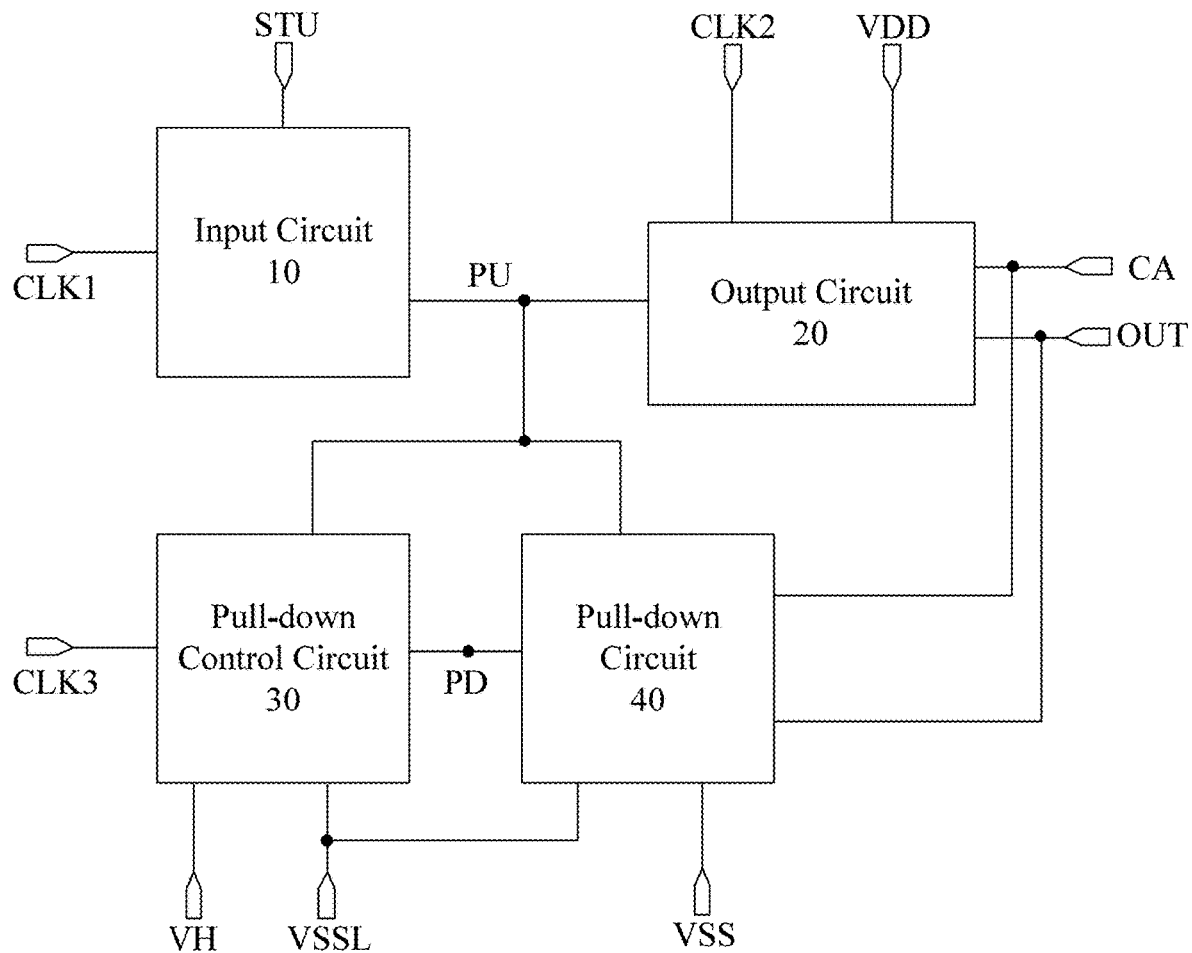
FIG. 1 is a schematic block diagram of a shift register unit provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including." etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be noted that the transistors used in the embodiments of the present disclosure may all be thin film transistors, field effect transistors or other switching devices with same characteristics. In the embodiments of the present disclosure, thin film transistors are taken as an example in the description. The source electrode and drain electrode of the transistors used here may be symmetrical in structure, so the source electrode and drain electrode may not be structurally different. In the embodiments of the present disclosure, in order to distinguish the two electrodes of the transistors other than the gate electrode, it is directly described that one of the electrodes is the first electrode and the other is the second electrode. In addition, the switching transistors used in the embodiments of the present disclosure may comprise any one of types of P-type switching transistors and N-type switching transistors. The P-type switching transistor is turned on when the gate electrode is at a low level and is turned off when the gate electrode is at a high level. The N-type switching transistor is turned on when the gate electrode is at a high level and is turned off when the gate electrode is at a low level. In addition, the plurality of signals in the embodiments of the present disclosure all correspond to the first electric potential and the second electric potential, and the first electric potential and the second electric potential only represent that the electric potential of the signal has two states, but do not represent that the first electric potential or the second electric potential has a specific value in the disclosure.

At least one embodiment of the present disclosure provides a shift register unit, which comprises an input circuit, an output circuit, a pull-down control circuit, and a pull-down circuit. At least one embodiment of the present disclosure also provides a gate drive circuit, a display device, and a driving method corresponding to the shift register unit.

The shift register unit, the gate drive circuit, the display device, and the driving method provided by the embodiments of the present disclosure can reduce the power consumption and improve the stability of the output driving signal as well.

The embodiments of the present disclosure will be described in detail below with reference to the drawings.

In the following embodiments of the present disclosure, it is described as an example in which each transistor is an N-type transistor and the first electric potential is a high electric potential relative to the second electric potential.

At least one embodiment of the present disclosure provides a shift register unit. For example, as illustrated in FIG. 1, the shift register unit may comprise an input circuit 10, an output circuit 20, a pull-down control circuit 30, and a pull-down circuit 40.

The input circuit 10 is connected to a first clock signal terminal CLK1, an input signal terminal STU and a pull-up node PU respectively, and is configured to control the electric potential of the pull-up node PU under the control of a first clock signal of the first clock signal terminal CLK1 and an input signal of the input signal terminal STU. For example, the input signal charges the pull-up node PU to raise the electric potential of the pull-up node PU.

The output circuit 20 is connected to a first direct current (DC) power supply terminal VDD, a second clock signal terminal CLK2, the pull-up node PU, a first driving signal output terminal OUT, and a second driving signal output terminal CA respectively, and is configured to output a first power supply signal of the first DC power supply terminal VDD to the first driving signal output terminal OUT, and output a second clock signal of the second clock signal terminal CLK2 to the second driving signal output terminal CA, under the control of the pull-up node PU. For example, in the embodiment of the present disclosure, the first DC power supply terminal VDD may maintain an input of a DC high level signal.

For example, the first driving signal output terminal OUT may be connected to a gate line of the display panel for outputting a gate driving signal to the display panel. For example, when the shift register units provided by the embodiment of the present disclosure are cascaded, the second driving signal output terminal CA of one shift register unit may be connected to the input signal terminal STU of the next shift register unit, and is configured to precharge the next shift register unit.

The pull-down control circuit 30 is connected to a third clock signal terminal CLK3, a second DC power supply terminal VH, a third DC power supply terminal VSSL, a pull-down node PD, and the pull-up node PU respectively, and is configured to control the electric potential of the pull-down node PD under the control of the pull-up node PU, a third clock signal of the third clock signal terminal CLK3, a second power supply signal of the second DC power supply terminal VH and a third power supply signal of the third DC power supply terminal VSSL. For example, in the embodiment of the present disclosure, the second DC power supply terminal VH may maintain an input of a DC high level signal, and the third DC power supply terminal VSSL may maintain an input of a DC low level signal.

The pull-down circuit 40 is connected to the pull-down node PD, the third DC power supply terminal VSSL, a fourth DC power supply terminal VSS, the pull-up node PU, the first driving signal output terminal OUT, and the second driving signal output terminal CA respectively, and is configured to control the electric potentials of the pull-up node PU, the first driving signal output terminal OUT, and the second driving signal output terminal CA through the third power supply signal and a fourth power supply signal of the fourth DC power supply terminal VSS, under the control of the pull-down node PD. For example, in the embodiment of the present disclosure, the fourth DC power supply terminal VSS may maintain an input of a DC low level signal, and may implement the noise reduction function for the pull-up node PU, the first driving signal output terminal OUT, and the second driving signal output terminal CA through the pull-down circuit 40.

The circuit structure of the shift register unit provided by the embodiment of the present disclosure is relatively simple, and the output circuit in the shift register unit is connected to the first DC power supply terminal to output the first power supply signal to the first driving signal output terminal as a driving signal. The shift register unit provided by the embodiment of the present disclosure uses a DC power supply signal as the driving signal and has a low power consumption, compared with the way that a jump clock signal output by a clock signal terminal is used as the driving signal.

Figure 2:
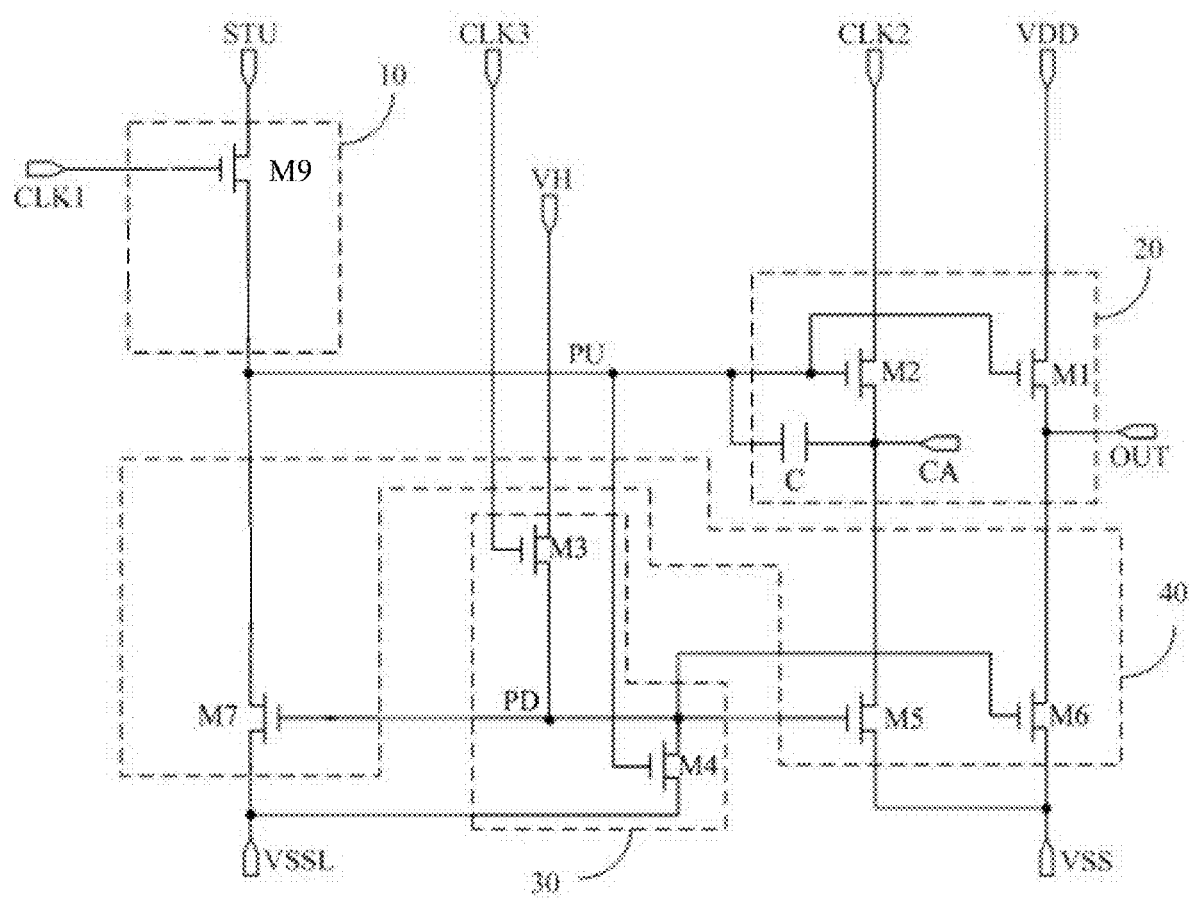
FIG. 2 is a schematic circuit diagram of a shift register unit provided by an embodiment of the present disclosure.

For example, in an embodiment of the present disclosure, as illustrated in FIG. 2, the output circuit 20 may specifically comprise a first transistor M1, a second transistor M2, and a capacitor C.

A gate electrode of the first transistor M1 is connected to the pull-up node PU, a first electrode is connected to the first DC power supply terminal VDD, and a second electrode is connected to the first driving signal output terminal OUT.

A gate electrode of the second transistor M2 is connected to the pull-up node PU, a first electrode of the second transistor M2 is connected to the second clock signal terminal CLK2, and a second electrode of the second transistor M2 is connected to the second driving signal output terminal CA.

A first electrode of the capacitor C is connected to the pull-up node PU, and a second electrode of the capacitor C is connected to the second driving signal output terminal CA.

For example, the first driving signal output terminal OUT may be connected to a gate line in the display panel for driving the pixel units connected to the gate line. For example, when the shift register units provided by the embodiment of the present disclosure are cascaded, the second driving signal output terminal CA of one shift register unit may be connected to the input signal terminal STU of the next shift register unit, and is configured to precharge the next shift register unit. When the electric potential of the pull-up node PU is the first electric potential, the first transistor M1 and the second transistor M2 are turned on, the first DC power supply terminal VDD may output the first power supply signal to the first driving signal output terminal OUT to drive the pixel units in the display panel to display, and the second clock signal terminal CLK2 may output the second clock signal to the second driving signal output terminal CA to precharge the next shift register unit.

The shift register unit provided by the embodiments of the present disclosure adopts two-stage output, which implements the separation of the driving signal and the shift signal, and ensures the stability of the output driving signal. For example, when the shift register units provided by the embodiments of the present disclosure are cascaded to constitute a gate drive circuit, the structure of two-stage output can avoid the influence of the unstable driving signal on the other shift register units in the gate drive circuit when the driving signal of a certain shift register unit is unstable, and improve the stability of the gate drive circuit during operation.

For example, as illustrated in FIG. 2, the pull-down control circuit 30 may comprise a third transistor M3 and a fourth transistor M4.

A gate electrode of the third transistor M3 is connected to the third clock signal terminal CLK3, a first electrode of the third transistor M3 is connected to the second DC power supply terminal VH, and a second electrode of the third transistor M3 is connected to the pull-down node PD.

A gate electrode of the fourth transistor M4 is connected to the pull-up node PU, a first electrode of the fourth transistor M4 is connected to the third DC power supply terminal VSSL, and a second electrode of the fourth transistor M4 is connected to the pull-down node PD.

As illustrated in FIG. 2, the pull-down circuit 40 may comprise a fifth transistor M5, a sixth transistor M6 and a seventh transistor M7.

A gate electrode of the fifth transistor M5 is connected to the pull-down node PD, a first electrode of the fifth transistor M5 is connected to the fourth DC power supply terminal VSS, and a second electrode of the fifth transistor M5 is connected to the second driving signal output terminal CA.

A gate electrode of the sixth transistor M6 is connected to the pull-down node PD, a first electrode of the sixth transistor M6 is connected to the fourth DC power supply terminal VSS, and a second electrode of the sixth transistor M6 is connected to the first driving signal output terminal OUT.

A gate electrode of the seventh transistor M7 is connected to the pull-down node PD, a first electrode of the seventh transistor M7 is connected to the third DC power supply terminal VSSL, and a second electrode of the seventh transistor M7 is connected to the pull-up node PU.

Figure 3:
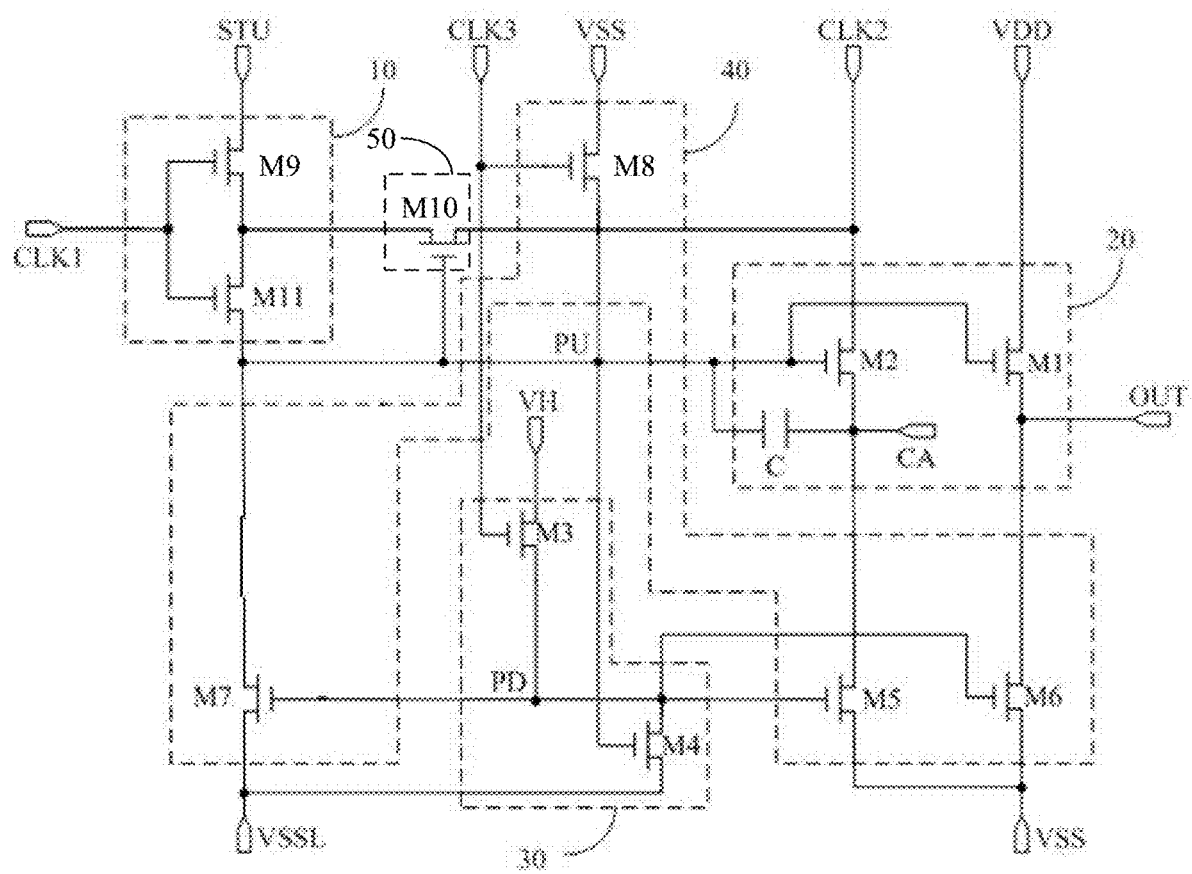
FIG. 3 is a schematic circuit diagram of another shift register unit provided by an embodiment of the present disclosure.

For example, in another embodiment of the present disclosure, as illustrated in FIG. 3, the pull-down circuit 40 may further comprise an eighth transistor M8.

A gate electrode of the eighth transistor M8 is connected to the third clock signal terminal CLK3, a first electrode of the eighth transistor M8 is connected to the fourth DC power supply terminal VSS, and a second electrode of the eighth transistor M8 is connected to the pull-up node PU. The eighth transistor M8 can output the fourth power supply signal with the second electric potential to the pull-up node PU when the third clock signal output by the third clock signal terminal CLK3 is at the first electric potential, so as to further pull down the electric potential of the pull-up node PU, that is, to implement noise reduction for the pull-up node PU.

As illustrated in FIG. 2, in an embodiment, the input circuit 10 may comprise a ninth transistor M9.

A gate electrode of the ninth transistor M9 is connected to the first clock signal terminal CLK1, a first electrode of the ninth transistor M9 is connected to the input signal terminal STU, and a second electrode of the ninth transistor M9 is connected to the pull-up node PU.

When the first clock signal of the first clock signal terminal CLK1 is at the first electric potential, through the ninth transistor M9, the input signal terminal STU may output the input signal to the pull-up node PU, thereby charging the pull-up node PU.

For example, in an embodiment of the present disclosure, as illustrated in FIG. 3, the input circuit 10 may further comprise an eleventh transistor M11. A gate electrode of the eleventh transistor M11 is connected to the first clock signal terminal CLK1, a first electrode of the eleventh transistor M11 is connected to the second electrode of the ninth transistor M9, and a second electrode of the eleventh transistor M11 is connected to the pull-up node PU.

Meanwhile, as illustrated in FIG. 3, the shift register unit provided by the embodiment of the present disclosure may further comprise an output control circuit 50. For example, the output control circuit 50 is connected to the pull-up node PU, the second clock signal terminal CLK2 and the second electrode of the ninth transistor M9 respectively, and is configured to electrically connect the second clock signal terminal CLK2 to the second electrode of the ninth transistor M9 under the control of the pull-up node PU.

For example, in an embodiment of the present disclosure, as illustrated in FIG. 3, the output control circuit 50 may comprise a tenth transistor M10. A gate electrode of the tenth transistor M10 is connected to the pull-up node PU, a first electrode of the tenth transistor M10 is connected to the second clock signal terminal CLK2, and a second electrode of the tenth transistor M10 is connected to the second electrode of the ninth transistor (i.e., the first electrode of the eleventh transistor M11). For example, when the tenth transistor M10 is an N-type transistor, the tenth transistor M10 may electrically connect the second clock signal terminal CLK2 to the second electrode of the ninth transistor M9 when the electric potential of the pull-up node PU is at the first electric potential.

When the shift register unit as illustrated in FIG. 3 is in the output phase, in case that the electric potential of the pull-up node PU is the first electric potential and the second clock signal terminal CLK2 is also at the first electric potential, the tenth transistor M10 is turned on. The second clock signal CLK2 may output the second clock signal to the first electrode of the eleventh transistor M11, so that both the electric potentials of the first electrode and the second electrode of the eleventh transistor M11 are the first electric potentials, so the influence of the leakage current of the ninth transistor M9 and the eleventh transistor M11 on the electric potential of the pull-up node PU can be prevented, and the stability of the output signal of the shift register unit can be improved.

Figure 4:
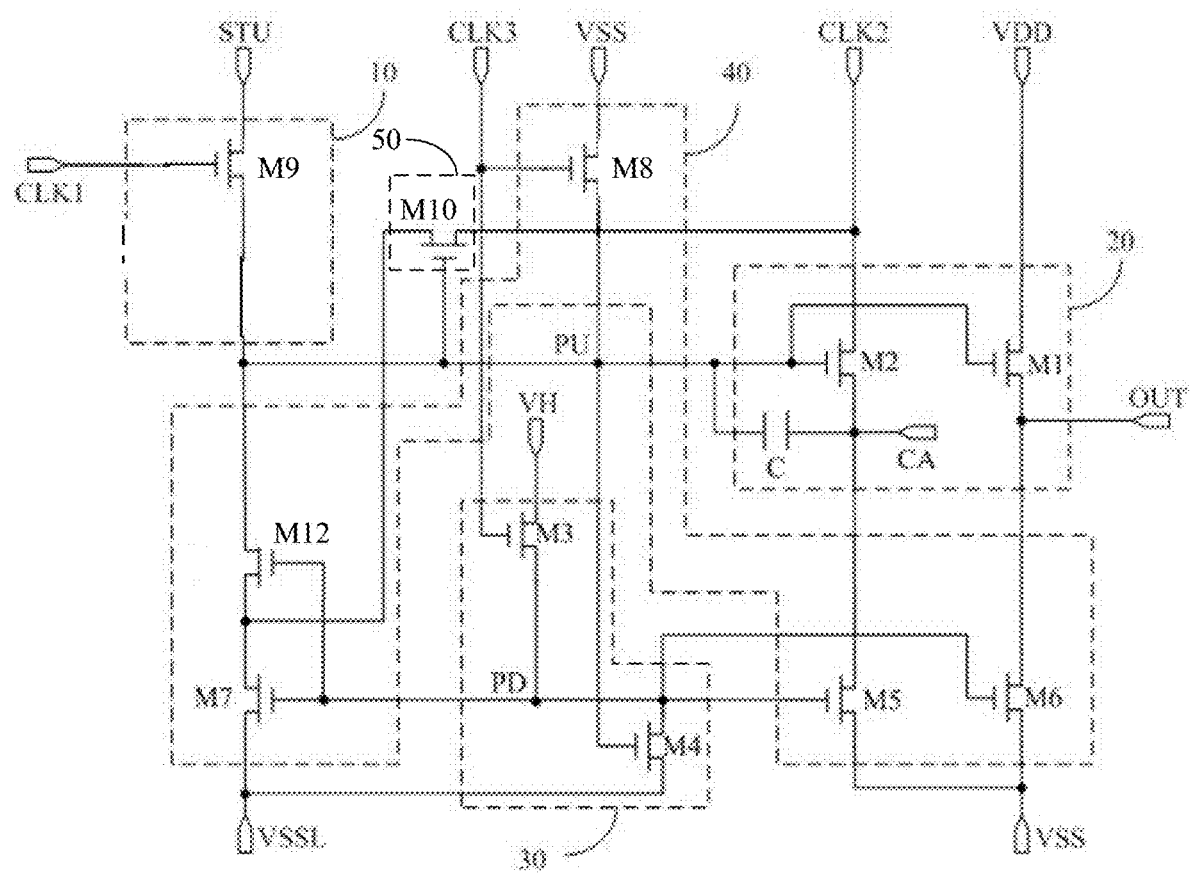
FIG. 4 is a schematic circuit diagram of further another shift register unit provided by an embodiment of the present disclosure.

For example, in another embodiment of the present disclosure, as illustrated in FIG. 4, the input circuit 10 may not comprise the eleventh transistor M11. In this embodiment, the pull-down circuit 40 may comprise a twelfth transistor M12.

A gate electrode of the twelfth transistor M12 is connected to the pull-down node PU, a first electrode of the twelfth transistor M12 is connected to the second electrode of the seventh transistor M7, and a second electrode of the twelfth transistor M12 is connected to the pull-up node PU.

Meanwhile, the shift register unit illustrated in FIG. 4 which is similar to the embodiment illustrated in FIG. 3 may further comprise an output control circuit 50. The output control circuit 50 is connected to the pull-up node PU, the second clock signal terminal CLK2 and the second electrode of seventh transistor M7 respectively, and is configured to electrically connect the second clock signal terminal CLK2 to the second electrode of the seventh transistor M7 under the control of the pull-up node PU.

For example, the output control circuit 50 in the shift register unit illustrated in FIG. 4 which is similar to the embodiment illustrated in FIG. 3, may comprise a tenth transistor M10. A gate electrode of the tenth transistor M10 is connected to the pull-up node PU, a first electrode of the tenth transistor M10 is connected to the second clock signal terminal CLK2, and a second electrode of the tenth transistor M10 is connected to the second electrode of the seventh transistor M7 (i.e., the first electrode of the twelfth transistor M12). For example, in case that the tenth transistor M10 is an N-type transistor, the tenth transistor M10 may electrically connect the second clock signal terminal CLK2 to the second electrode of the seventh transistor M7 when the electric potential of the pull-up node PU is the first electric potential.

When the shift register unit illustrated in FIG. 4 is in the output phase, in case that the electric potential of the pull-up node PU is the first electric potential and the second clock signal terminal CLK2 is also at the first electric potential, the tenth transistor M10 is turned on. The second clock signal terminal CLK2 may output the second clock signal to the first electrode of the twelfth transistor M12, so that both the electric potentials of the first electrode and the second electrode of the twelfth transistor M12 are the first electric potentials, so the influence of the leakage current of the seventh transistor M7 and the twelfth transistor M12 on the electric potential of the pull-up node PU can be prevented, and the stability of the output signal of the shift register unit can be improved.

Figure 5:
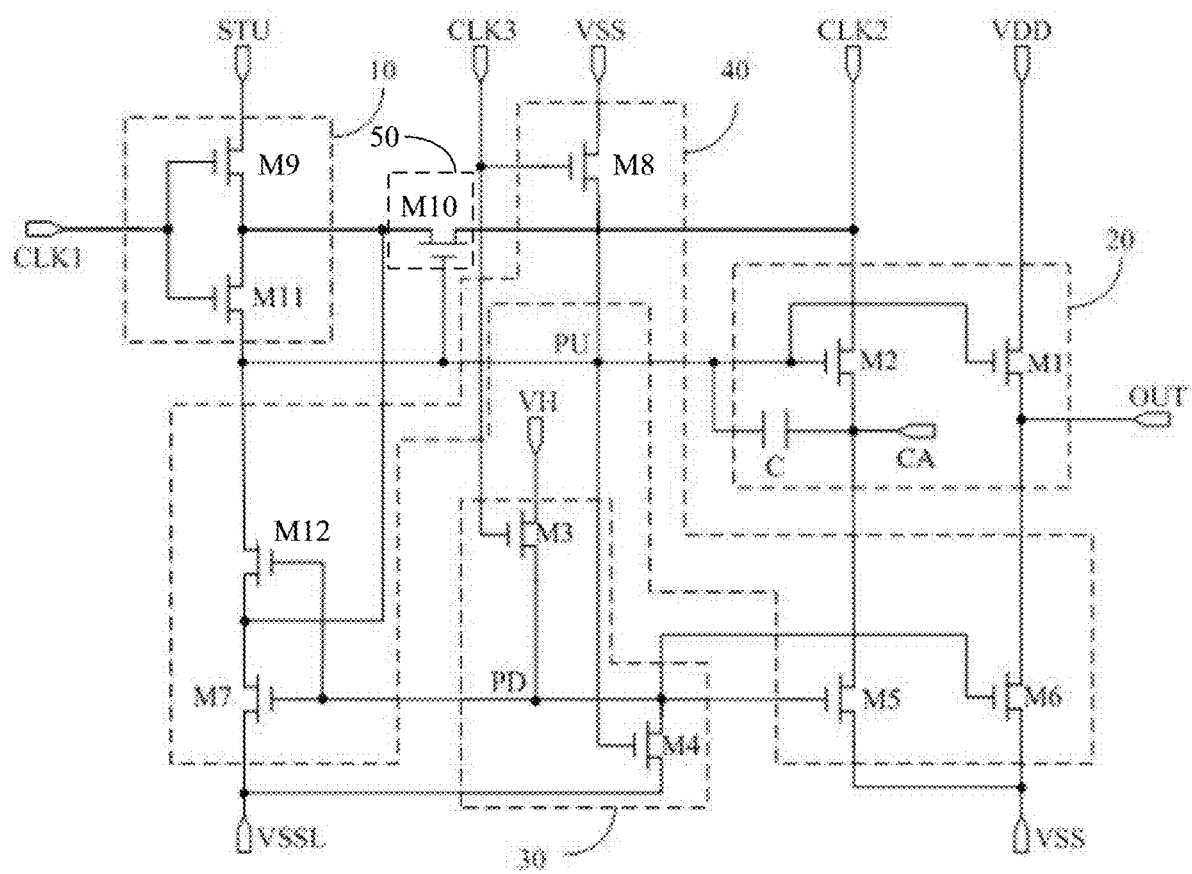
FIG. 5 is a schematic circuit diagram of still further another shift register unit provided by an embodiment of the present disclosure.

For example, in another embodiment of the present disclosure, as illustrated in FIG. 5, based on the shift register unit illustrated in FIG. 4, the input circuit 10 may further comprise an eleventh transistor M11.

A gate electrode of the eleventh transistor M11 is connected to the first clock signal terminal CLK1, a first electrode of the eleventh transistor M11 is connected to the second electrode of the ninth transistor M9, and a second electrode of the eleventh transistor M11 is connected to the pull-up node PU. Meanwhile, the second electrode of the tenth transistor M10 is connected to the first electrode of the eleventh transistor M11.

Meanwhile, the shift register unit illustrated in FIG. 5 which is similar to the embodiments illustrated in FIG. 3 and FIG. 4 may further comprise an output control circuit 50. The output control circuit 50 is connected to the pull-up node PU, the second clock signal terminal CLK2, the second electrode of the ninth transistor M9 and the second electrode of the seventh transistor M7 respectively, and is configured to electrically connect the second clock signal terminal CLK2 to both the second electrode of the ninth transistor M9 and the second electrode of the seventh transistor M7 under the control of the pull-up node PU.

For example, the output control circuit 50 in the shift register unit illustrated in FIG. 5 which is similar to the embodiments illustrated in FIGS. 3 and 4 may comprise a tenth transistor M10. A gate electrode of the tenth transistor M10 is connected to the pull-up node PU, a first electrode of the tenth transistor M10 is connected to the second clock signal terminal CLK2, and a second electrode of the tenth transistor M10 is connected to both the first electrode of the twelfth transistor M12 (i.e., the second electrode of the seventh transistor M7) and the first electrode of the eleventh transistor M11 (i.e., the second electrode of the ninth transistor M9). For example, in case that the tenth transistor M10 is an N-type transistor, the tenth transistor M10 may connect the second clock signal terminal CLK2 to both the first electrode of the twelfth transistor M12 (i.e., the second electrode of the seventh transistor M7) and the first electrode of the eleventh transistor M11 (i.e., the second electrode of the ninth transistor M9) when the electric potential of the pull-up node PU is the first electric potential.

When the shift register unit illustrated in FIG. 5 is in the output phase, in case that the electric potential of the pull-up node PU is the first electric potential and the second clock signal terminal CLK2 is also at the first electric potential, the tenth transistor M10 is turned on. The second clock signal terminal CLK2 may output the second clock signal to the first electrode of the eleventh transistor M11 and the first electrode of the twelfth transistor M12 respectively, so that both the electric potentials of the first electrode and the second electrode of the eleventh transistor M11 are the first electric potentials, and both the first electrode and the second electrode of the twelfth transistor M12 are the first electric potentials, so the influence of the leakage current of the eleventh transistor M11, the seventh transistor M7 and the twelfth transistor M12 on the electric potential of the pull-up node PU can be prevented, and the stability of the output signal of the shift register unit can be improved.

It should be noted that in the shift register unit provided by the embodiments of the present disclosure, the first DC power supply terminal VDD and the second DC power supply terminal VH may be separately set, i.e., not be electrically connected (as illustrated in FIGS. 1-5), and for example, both are connected to a DC high level signal line, which can provide a DC high level signal to the shift register unit. For example, the first DC power supply terminal VDD and the second DC power supply terminal VH may also be set as one power supply terminal, and for example, the power supply terminal is connected to a DC high level signal line, which can provide a DC high level signal to the shift register unit. It is not limited in the embodiments of the present disclosure.

In addition, it should be noted that, in the shift register unit provided by the embodiments of the present disclosure, the third DC power supply terminal VSSL and the fourth DC power supply terminal VSS may be separately set, i.e., not be electrically connected (as illustrated in FIGS. 1-5), and for example, both are connected to a DC low level signal line, which can provide a DC low level signal to the shift register unit. For example, the third DC power supply terminal VSSL and the fourth DC power supply terminal VSS may also be set as one power supply terminal. For example, the power supply terminal is connected to a DC low level signal line, which can provide a DC low level signal to the shift register unit. It is not limited in the embodiments of the present disclosure.

The embodiments of the present disclosure provide a shift register unit. The output circuit of the shift register unit is connected to the first DC power supply terminal, and is capable of outputting the first power supply signal to the first driving signal output terminal as the driving signal. The power consumption of the shift register unit provided by the embodiments of the present disclosure is relatively low, compared with the way that a jump clock signal output by a clock signal terminal is used as the driving signal. Meanwhile, the shift register unit provided by the embodiments of the present disclosure also adopts two-stage output, which can separate the driving signal and the shift signal, so that the stability of the output driving signal can be improved.

At least one embodiment of the present disclosure also provides a driving method for a shift register unit, which can be used to drive anyone of the shift register units provided by the embodiments of the present disclosure. For example, as illustrated in FIG. 6, the method may comprise the following operations.

Step S101, a charging phase: the first clock signal terminal CLK1 outputting the first clock signal, the input signal terminal STU outputting the input signal, and the input circuit 10 outputting the input signal to the pull-up node PU under the control of the first clock signal.

Step S102, an output phase: the second clock signal terminal CLK2 outputting the second clock signal, the first DC power supply terminal VDD outputting the first power supply signal, the pull-up node PU maintaining the electric potential of the input signal, and the output circuit 20 outputting the second clock signal to the second driving signal output terminal CA and outputting the first power supply signal to the first driving signal output terminal OUT under the control of the pull-up node PU.

Step S103, a noise reduction phase: the third clock signal terminal CLK3 outputting the third clock signal, the second DC power supply terminal VH outputting the second power supply signal, and the pull-down control circuit 30 outputting the second power supply signal to the pull-down node PD under the control of the third clock signal. The pull-down circuit 40, under the control of the pull-down node PD, outputting the third power supply signal of the third DC power supply terminal VSSL to the pull-up node PU, and outputting the fourth power supply signal of the fourth DC power supply terminal VSS to the second driving signal output terminal CA and the first driving signal output terminal OUT respectively.

Figure 7:
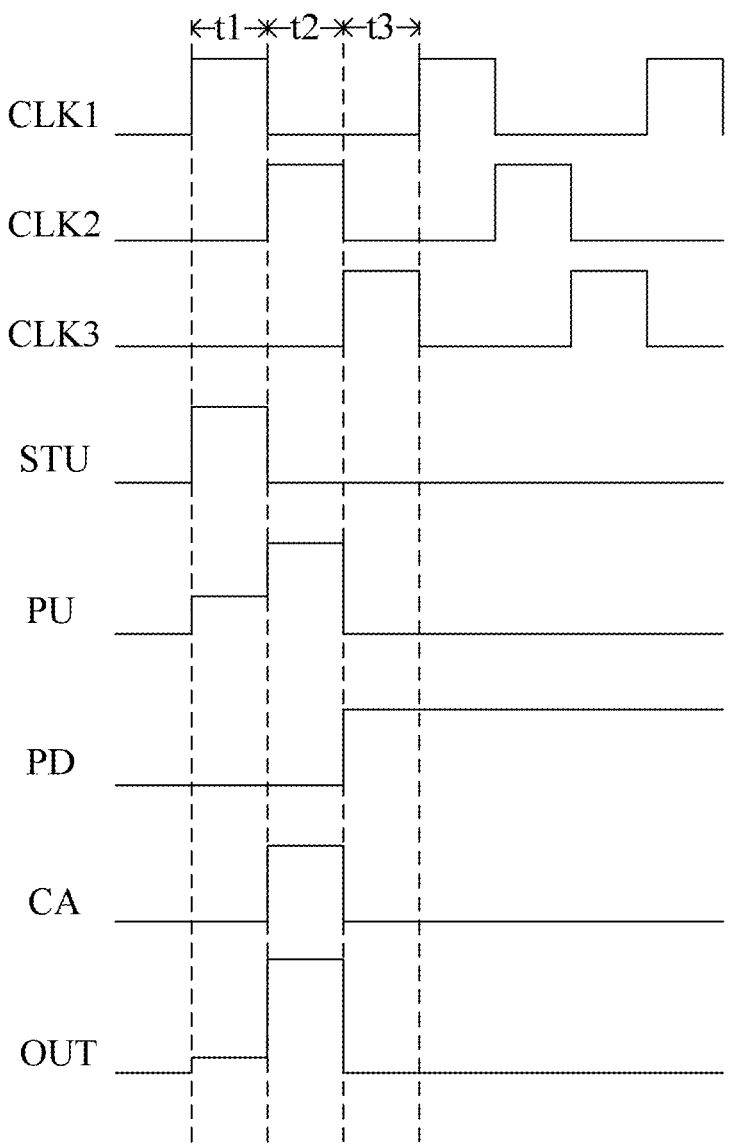
FIG. 7 is a driving timing diagram of a shift register unit provided by an embodiment of the present disclosure.

FIG. 7 is a driving timing diagram of a shift register unit provided by an embodiment of the present disclosure. Taking the shift register unit illustrated in FIG. 5 as an example, the driving principle of the shift register unit provided by the embodiment of the present disclosure is described in detail. In the present embodiment, it is taken as an example that each transistor in the shift register unit is an N-type transistor, and the first electric potential is a high electric potential relative to the second electric potential.

Referring to FIG. 7, in a charging phase t1, the first clock signal of the first clock signal terminal CLK1 is at a high level, which may be, for example, 20V; and both the clock signals of the other two clock signal terminals are at low levels, which may be, for example, −10V, and the input signal of the input signal terminal STU is at a high level, which may be, for example, 20V. At this time, the ninth transistor M9 and the eleventh transistor M11 are turned on, and the input signal terminal STU output the input signal to the pull-up node PU to charge the pull-up node PU. Because the pull-up node PU is charged to a first high level, the first transistor M1 and the second transistor M2 are slightly turned on, so that the voltage of the first driving signal output terminal OUT is raised under the control of the first DC power supply terminal VDD. However, the voltage after being raised is less than 0V. Further, because the pull-up node PU is at a high level, the fourth transistor M4 may be turned on, and the third DC power supply terminal VSSL may output the third power supply signal which is at a low level (e.g., −10 V) to the pull-down node PD, so that the transistors in the pull-down circuit 40 are turned off.

In an output stage t2, the second clock signal of the second clock signal terminal CLK2 is at a high level, and both the clock signals output by the other two clock signal terminals are at low levels. Because the second transistor M2 is slightly turned on in the charging phase t1, the second clock signal terminal CLK2 outputs the second clock signal to the second driving signal output terminal CA. When the second clock signal jumps to a high level in the output stage t2, due to the coupling effect of the capacitor C, the level of the pull-up node PU is further increased with the increasing of the level of the second driving signal output terminal CA to reach a second high level. At this time, the first transistor M1 is fully turned on, and the first DC power supply terminal VDD outputs the first power supply signal which is at a high level (for example, 20V) to the first driving signal output terminal OUT to drive the pixel units in the display panel to display.

Further, because the pull-up node PU is at a high level, the fourth transistor M4 may be turned on, and the third DC power supply terminal VSSL may output the third power supply signal at a low level to the pull-down node PD, so that each transistor of the pull-down circuits 40 is turned off to avoid affecting the levels of the pull-up node PU, the second driving signal output terminal CA, and the first driving signal output terminal OUT, thereby ensuring the stability of the output signal of the shift register unit.

In addition, in the output phase t2, because the pull-up node PU is at a high level, the tenth transistor M10 is also turned on, and the second clock signal terminal CLK2 can respectively output the second clock signal which is at a high level to the first electrode of the eleventh transistor M11 and the first electrode of the twelfth transistor M12, so that the first electrode and the second electrode of the eleventh transistor M11 and the twelfth transistor M12 are all at high levels, thereby preventing the influence of the leakage current of the eleventh transistor M11 and the twelfth transistor M12 on the level of the pull-up node PU, and further improving the stability of the output signal of the shift register unit.

Further, in a noise reduction phase t3, the third clock signal of the third clock signal terminal CLK3 is at a high level, the third transistor M3 is turned on, and the second DC power supply terminal VH outputs the second power supply signal which is at a high level to the pull-down node PD. The fifth transistor M5, the sixth transistor M6, the seventh transistor M7 and the twelfth transistor M12 are turned on under the control of the pull-down node PD. At this time, the third DC power supply terminal VSSL may output the third power supply signal which is at a low level to the pull-up node PU, so that the pull-up node PU can be denoised. The fourth DC power supply terminal VSS may output the fourth power supply signal which is at a low level (e.g., may be −8V) to the second driving signal output terminal CA and the first driving signal output terminal OUT respectively, so that the second driving signal output terminal CA and the first driving signal output terminal OUT can be denoised. In addition, because the third clock signal can also drive the eighth transistor M8 to be turned on, it enables the fourth DC power supply terminal VSS to output the fourth power supply signal to the pull-up node PU, thereby effectively pulling down the level of the pull-up node PU, and further implementing the noise reduction for the pull-up node PU.

It should be noted that in the embodiment of the present disclosure, as can be seen in FIG. 7, the frequencies of the clock signals of the first clock signal terminal CLK1, the second clock signal terminal CLK2, and the third clock signal terminal CLK3 are the same and the duty ratio is one third, and the three clock signal terminals can output high level signals in sequence. That is, the first clock signal is at the first electric potential during the charging phase t1, and is at the second electric potential during both the output phase t2 and the noise reduction phase t3; the second clock signal is at the first electric potential during the output phase t2, and is at the second electric potential during both the charging phase t1 and the noise reduction phase t3; and the third clock signal is at the first electric potential during the noise reduction phase t3, and is at the second electric potential during both the output phase t2 and the charging phase t1. For example, the high level of each clock signal may be 20V and the low level may be −10V.

In addition, in the embodiment of the present disclosure, the first power supply signal of the first DC power supply terminal VDD may have a level of 20V, and the second power supply signal of the second DC power supply terminal VH may have a level of 20V. The third power supply signal of the third DC power supply terminals VSSL may have a level of −10V, the fourth power supply signal of the fourth DC power supply terminal VSS may have a level of −8V, and the input signal of the input signal terminal STU may have a high level of 20V and have a low level of −10V.

In practical applications, the specific value of the level of the signal output by each power supply terminal and signal terminal may be adjusted according to the actual circuit requirements. For example, the first power supply signal and the second power supply signal may have a level of 25V, and each clock signal may have a high level of 25V as well, which is not limited in the embodiment of the present disclosure.

Figure 8:
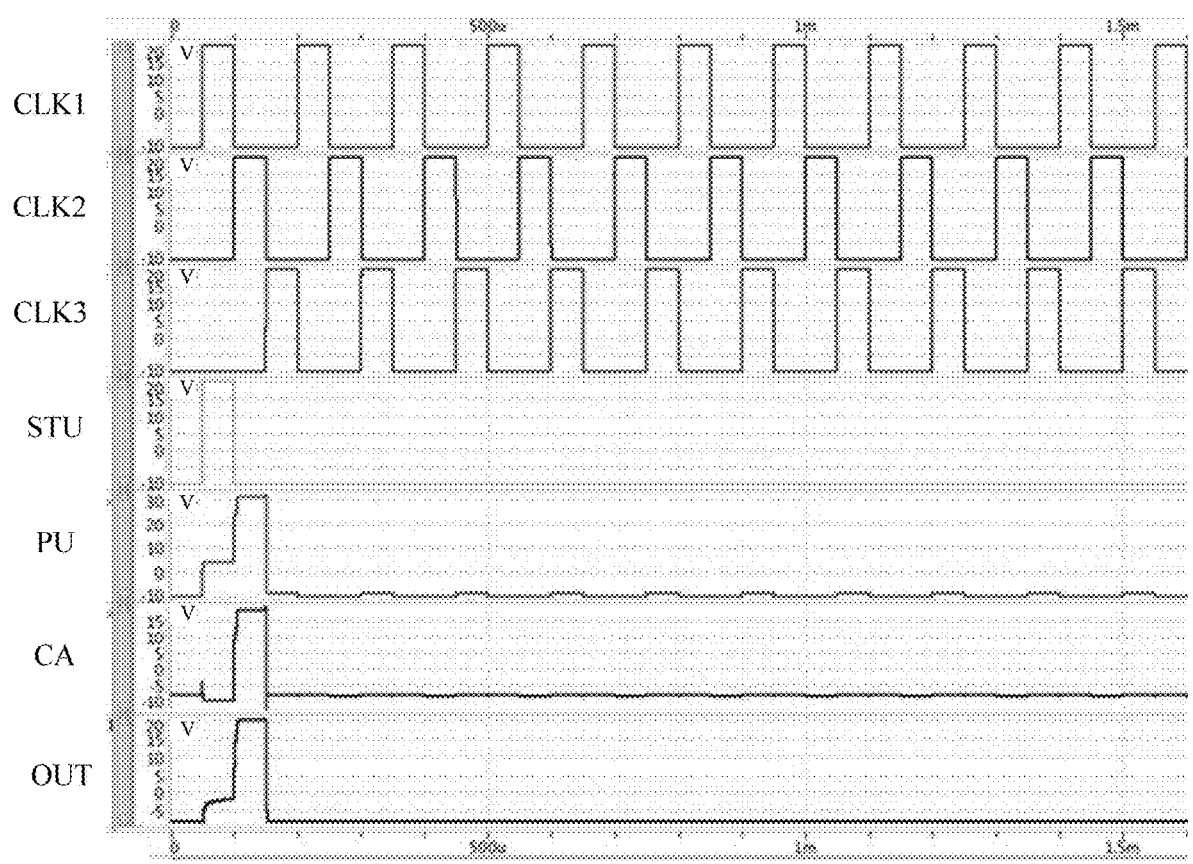
FIG. 8 is a simulation waveform diagram of each signal terminal of a shift register unit provided by an embodiment of the present disclosure.
Figure 9:
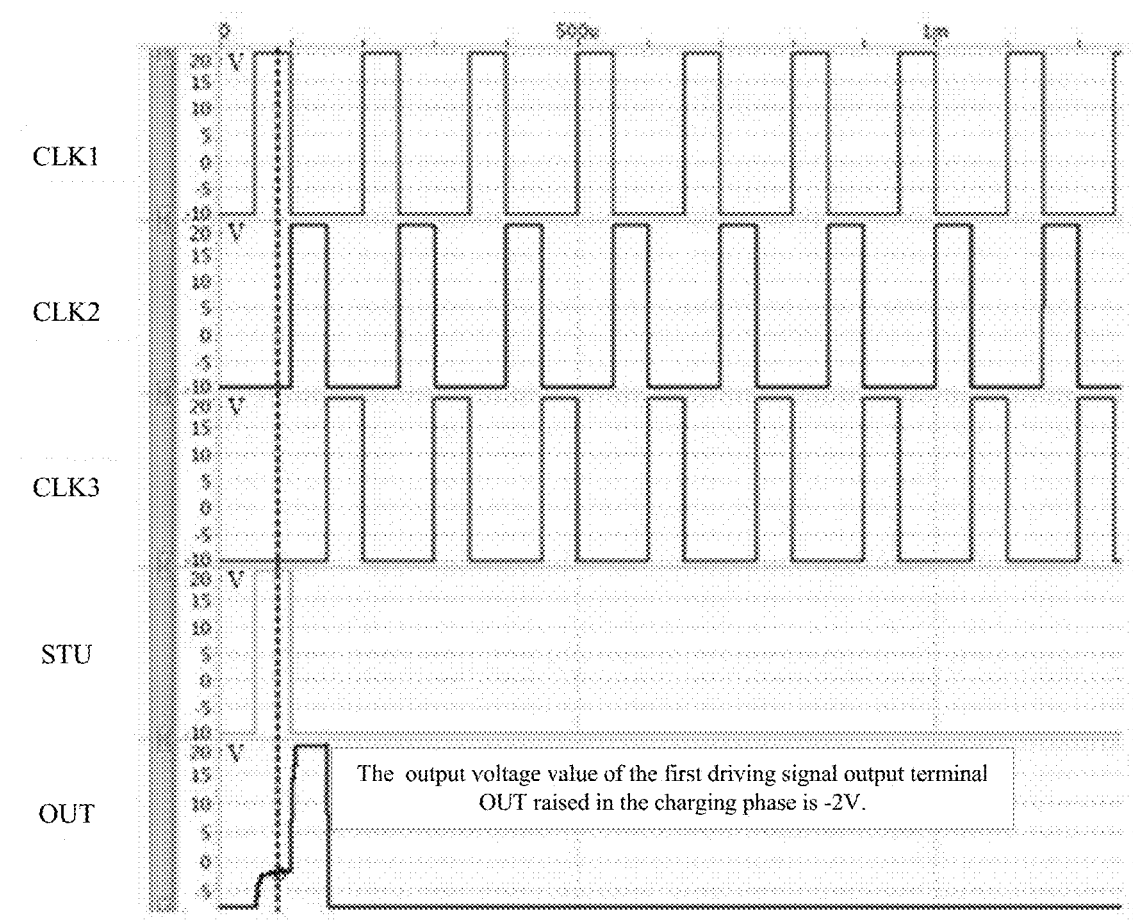
FIG. 9 is a simulation waveform diagram of an output terminal of a shift register unit provided by an embodiment of the present disclosure.

FIG. 8 is a simulation waveform diagram of the signal terminals of a shift register unit provided by an embodiment of the present disclosure, and FIG. 9 is a simulation waveform diagram of an output terminal of a shift register unit provided by an embodiment of the present disclosure. As can be seen in FIG. 8 and FIG. 9, the first driving signal output terminal OUT of the shift register unit can output the first power supply signal of the first DC power supply terminal VDD nearly at full swing, thereby achieving a rail-to-rail output and reducing the consumption of the output signal.

In addition, as can also be seen in FIG. 9, when the first power supply signal of the first DC power supply terminal VDD has a level of 20V, the voltage value of the first driving signal output terminal OUT after being raised in the charging phase t1 may be −2V.

It should be noted that in the foregoing embodiments, it is taken as an example that the first to the twelfth transistors are all N-type transistors, and the first electric potential is a high electric potential relative to the second electric potential. Of course, the first to the twelfth transistors may also be P-type transistors. When the first to the twelfth transistors are P-type transistors, the first electric potential may be a low electric potential relative to the second electric potential, and the electric potential change of each signal terminal may be opposite to the electric potential change as illustrated in FIG. 7 to FIG. 9.

Figure 10:
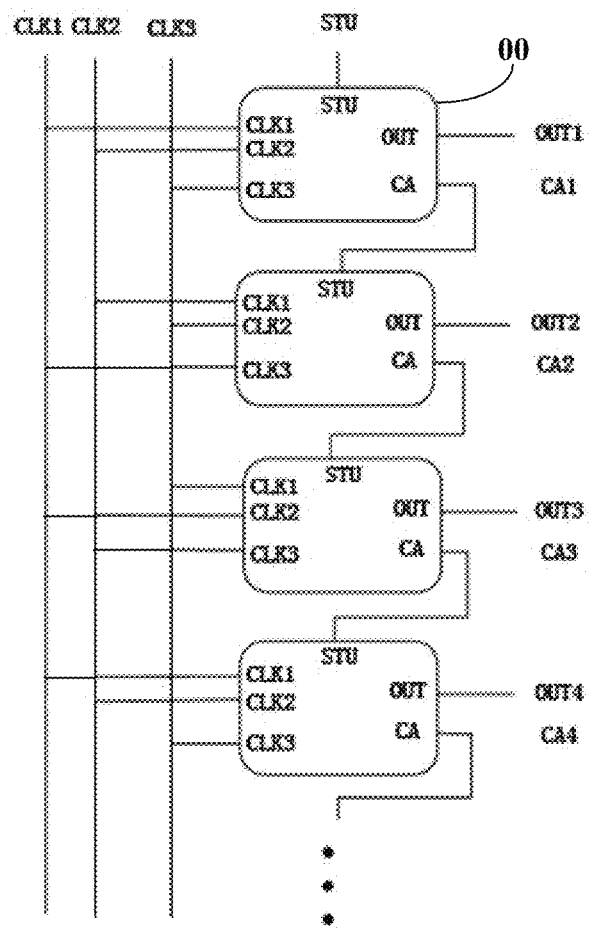
FIG. 10 is a schematic structural diagram of a gate drive circuit provided by an embodiment of the present disclosure.

An embodiment of the present disclosure further provides a gate drive circuit. As illustrated in FIG. 10, the gate drive circuit comprises a plurality of cascaded shift register units 00, and for example, each shift register unit 00 may be anyone of the shift register units provided by the embodiments of the present disclosure.

For example, as illustrated in FIG. 10, expect the first shift register unit, the input signal terminal STU of each shift register unit is connected to the second driving signal output terminal CA of the previous shift register unit.

It should be noted that the technical effects of the gate drive circuit provided by the embodiments of the present disclosure may be referred to the corresponding description of the shift register unit in the embodiments of the present disclosure, which will not be repeated here.

Figure 11:
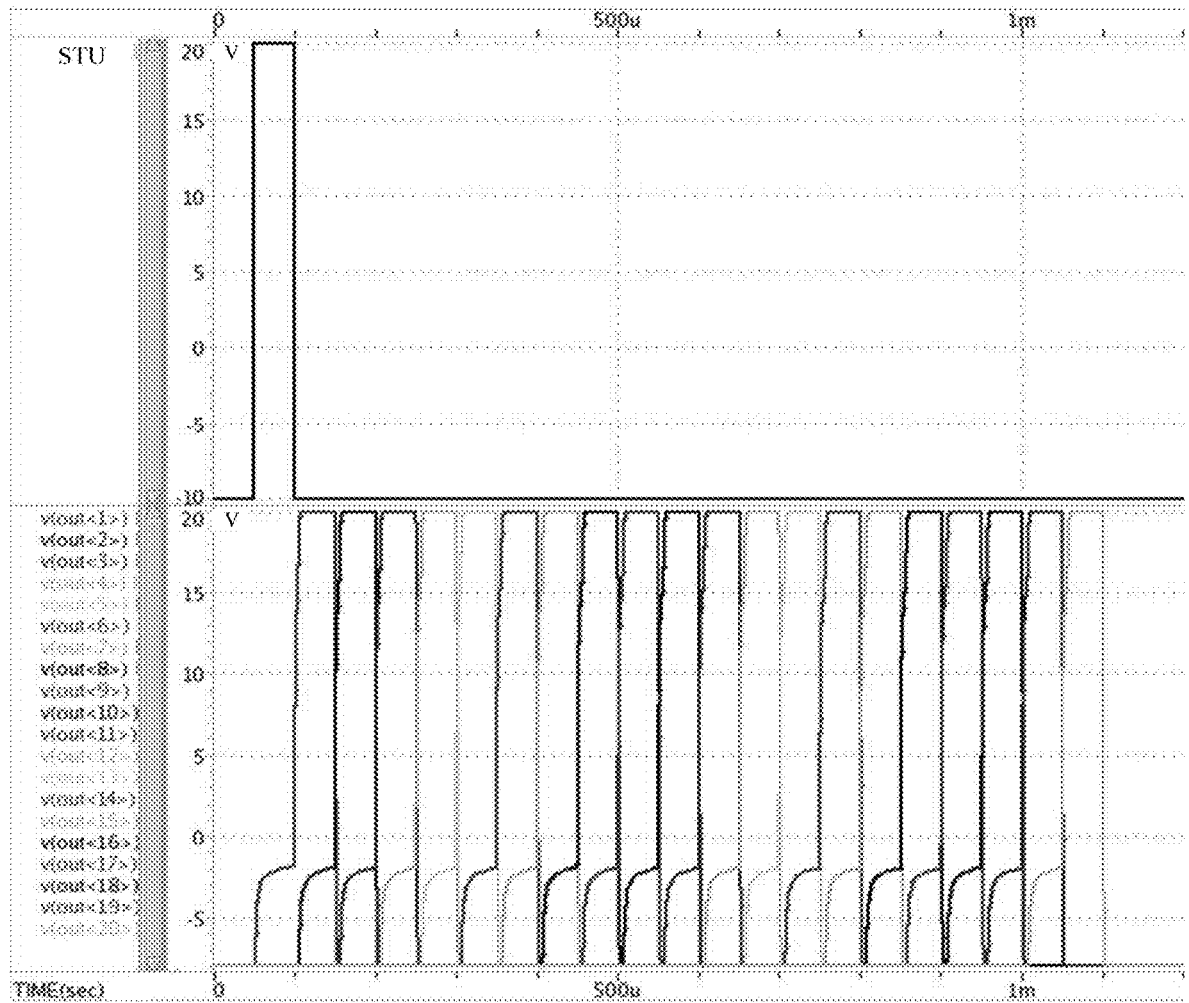
FIG. 11 is a simulation waveform diagram of output terminals of 20 cascaded shift register units provided by an embodiment of the present disclosure.

FIG. 11 is a simulation waveform diagram of output terminals of 20 cascaded shift register units provided by an embodiment of the present disclosure, assuming that the input signal output by the signal terminal connected to the input signal terminal STU of the first shift register unit has a high level of 20V, and the first power supply signal of the first DC power supply terminal VDD also has a level of 20V. As can be seen in FIG. 11, the 20 cascaded shift register units can sequentially output the driving signals with a level of 20V, and the stability of the driving signal output by each shift register unit is good.

Figure 12:
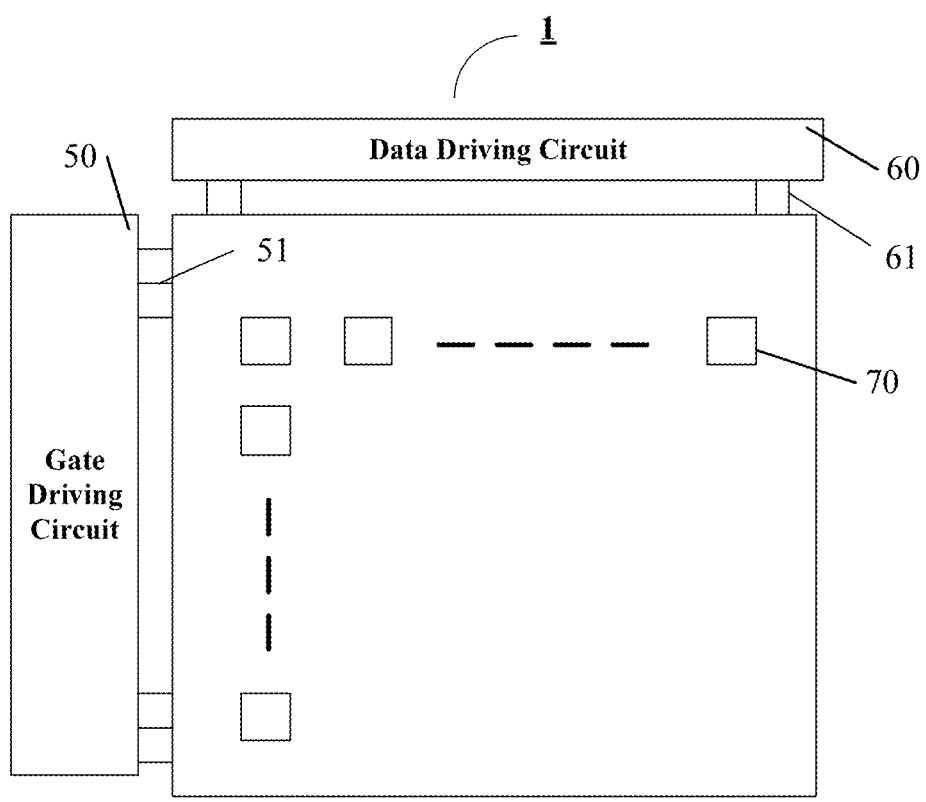
FIG. 12 is a schematic diagram of a display device provided by an embodiment of the present disclosure.

An embodiment of the present disclosure also provides a display device 1 as illustrated in FIG. 12, which comprises the gate drive circuit 50 provided by the embodiments of the present disclosure. The display device 1 comprises an array of a plurality of pixel units 70. For example, the display device 1 may further comprise a data driving circuit 60. The data driving circuit 60 is configured to provide data signals to the pixel array; and the gate drive circuit 50 is configured to provide gate scanning signals to the pixel array. The data driving circuit 60 is electrically connected to the pixel units 70 through data lines 61, and the gate drive circuit 50 is electrically connected to the pixel units 70 through gate lines 51.

For example, the display device 1 may be a liquid crystal panel, an electronic paper, an OLED panel, an OLED TV, a mobile phone, a tablet computer, a television, a monitor, a notebook computer, a digital photo frame, a navigator, or any product or component having a display function.

The technical effects of the display device provided by the embodiments of the present disclosure may refer to the corresponding description of the shift register unit in the above embodiments, which will not be repeated here.

Those skilled in the art can clearly understand that, for convenience and brevity of description, the specific working process of the shift register unit and each circuit described above may be referred to the corresponding process in the embodiment of the foregoing method, which will not be repeated here.

What are described above is related to the illustrative embodiments of the disclosure only and not limitative to the scope of the disclosure; the scopes of the disclosure are defined by the accompanying claims.

What is claimed is:

1. A shift register unit, comprising: an input circuit, an output circuit, a pull-down control circuit and a pull-down circuit, wherein the input circuit is connected to a first clock signal terminal, an input signal terminal and a pull-up node respectively, and the input circuit is configured to control an electric potential of the pull-up node under control of a first clock signal of the first clock signal terminal and an input signal of the input signal terminal;

the output circuit is connected to a first DC power supply terminal, a second clock signal terminal, the pull-up node, a first driving signal output terminal and a second driving signal output terminal respectively, and the output circuit is configured, under control of the electric potential of the pull-up node, to output a first power supply signal of the first DC power supply terminal to the first driving signal output terminal, and output a second clock signal of the second clock signal terminal to the second driving signal output terminal;

the pull-down control circuit is connected to a third clock signal terminal, a second DC power supply terminal, a third DC power supply terminal, a pull-down node and the pull-up node respectively, and the pull-down control circuit is configured to control an electric potential of the pull-down node under control of the electric potential of the pull-up node, a third clock signal of the third clock signal terminal, a second power supply signal of the second DC power supply terminal and a third power supply signal of the third DC power supply terminal; and the pull-down circuit is connected to the pull-down node, the third DC power supply terminal, a fourth DC power supply terminal, the pull-up node, the first driving signal output terminal and the second driving signal output terminal respectively, and the pull-down circuit is configured to control, under control of the electric potential of the pull-down node, electric potentials of the pull-up node, the first driving signal output terminal and the second driving signal output terminal through the third power supply signal and a fourth power supply signal of the fourth DC power supply terminal.

2. The shift register unit according to claim 1, wherein the output circuit comprises a first transistor, a second transistor and a capacitor;
- a gate electrode of the first transistor is connected to the pull-up node, a first electrode of the first transistor is connected to the first DC power supply terminal, and a second electrode of the first transistor is connected to the first driving signal output terminal;
- a gate electrode of the second transistor is connected to the pull-up node, a first electrode of the second transistor is connected to the second clock signal terminal, and a second electrode of the second transistor is connected to the second driving signal output terminal; and
- a first electrode of the capacitor is connected to the pull-up node, and a second electrode of the capacitor is connected to the second driving signal output terminal.

3. The shift register unit according to claim 1, wherein the pull-down control circuit comprises a third transistor and a fourth transistor;
- a gate electrode of the third transistor is connected to the third clock signal terminal, a first electrode of the third transistor is connected to the second DC power supply terminal, and a second electrode of the third transistor is connected to the pull-down node; and
- a gate electrode of the fourth transistor is connected to the pull-up node, a first electrode of the fourth transistor is connected to the third DC power supply terminal, and a second electrode of the fourth transistor is connected to the pull-down node.

4. The shift register unit according to claim 1, wherein the pull-down circuit comprises a fifth transistor, a sixth transistor and a seventh transistor;
- a gate electrode of the fifth transistor is connected to the pull-down node, a first electrode of the fifth transistor is connected to the fourth DC power supply terminal, and a second electrode of the fifth transistor is connected to the second driving signal output terminal;
- a gate electrode of the sixth transistor is connected to the pull-down node, a first electrode of the sixth transistor is connected to the fourth DC power supply terminal, and a second electrode of the sixth transistor is connected to the first driving signal output terminal; and
- a gate electrode of the seventh transistor is connected to the pull-down node, a first electrode of the seventh transistor is connected to the third DC power supply terminal, and a second electrode of the seventh transistor is connected to the pull-up node.

5. The shift register unit according to claim 4, wherein the pull-down circuit further comprises an eighth transistor; and
- a gate electrode of the eighth transistor is connected to the third clock signal terminal, a first electrode of the eighth transistor is connected to the fourth DC power supply terminal, and a second electrode of the eighth transistor is connected to the pull-up node.

6. The shift register unit according to claim 1, wherein the input circuit comprises a ninth transistor; and
- a gate electrode of the ninth transistor is connected to the first clock signal terminal, a first electrode of the ninth transistor is connected to the input signal terminal, and a second electrode of the ninth transistor is connected to the pull-up node.

7. The shift register unit according to claim 6, further comprising an output control circuit,
- wherein the output control circuit is connected to the pull-up node, the second clock signal terminal and the second electrode of the ninth transistor respectively, and the output control circuit is configured to electrically connect the second clock signal terminal to the second electrode of the ninth transistor under control of the electric potential of the pull-up node; and
- the input circuit further comprises an eleventh transistor, a gate electrode of the eleventh transistor is connected to the first clock signal terminal, a first electrode of the eleventh transistor is connected to the second electrode of the ninth transistor, and a second electrode of the eleventh transistor is connected to the pull-up node.

8. The shift register unit according to claim 7, wherein the output control circuit comprises a tenth transistor,
- a gate electrode of the tenth transistor is connected to the pull-up node, a first electrode of the tenth transistor is connected to the second clock signal terminal, and a second electrode of the tenth transistor is connected to the second electrode of the ninth transistor.

9. The shift register unit according to claim 4, further comprising an output control circuit,
- wherein the output control circuit is connected to the pull-up node, the second clock signal terminal and the second electrode of the seventh transistor respectively, and the output control circuit is configured to electrically connect the second clock signal terminal to the second electrode of the seventh transistor under control of the electric potential of the pull-up node; and
- the pull-down circuit further comprises a twelfth transistor, a gate electrode of the twelfth transistor is connected to the pull-down node, a first electrode of the twelfth transistor is connected to the second electrode of the seventh transistor, and a second electrode of the twelfth transistor is connected to the pull-up node.

10. The shift register unit according to claim 9, wherein the output control circuit comprises a tenth transistor,
- a gate electrode of the tenth transistor is connected to the pull-up node, a first electrode of the tenth transistor is connected to the second clock signal terminal, and a second electrode of the tenth transistor is connected to the second electrode of the seventh transistor.

11. The shift register unit according to claim 4, wherein the pull-down circuit further comprises a twelfth transistor, a gate electrode of the twelfth transistor is connected to the pull-down node, a first electrode of the twelfth transistor is connected to the second electrode of the seventh transistor, and a second electrode of the twelfth transistor is connected to the pull-up node;
- the input circuit comprises a ninth transistor and an eleventh transistor, a gate electrode of the ninth transistor is connected to the first clock signal terminal, a first electrode of the ninth transistor is connected to the input signal terminal, a second electrode of the ninth transistor is connected to a first electrode of the eleventh transistor, a gate electrode of the eleventh transistor is connected to the first clock signal terminal, and a second electrode of the eleventh transistor is connected to the pull-up node; and
- the shift register unit further comprises an output control circuit, wherein the output control circuit is connected to the pull-up node, the second clock signal terminal, the second electrode of the ninth transistor and the second electrode of seventh transistor respectively, and the output control circuit is configured to electrically connect the second clock signal terminal to both the second electrode of the ninth transistor and the second electrode of the seventh transistor under control of the electric potential of the pull-up node.

12. The shift register unit according to claim 11, wherein the output control circuit comprises a tenth transistor, a gate electrode of the tenth transistor is connected to the pull-up node, a first electrode of the tenth transistor is connected to the second clock signal terminal, and a second electrode of the tenth transistor is connected to the first electrode of the twelfth transistor and the first electrode of the eleventh transistor.

13. The shift register unit according to claim 1, wherein the first DC power supply terminal is electrically connected to the second DC power supply terminal.

14. The shift register unit according to claim 1, wherein the third DC power supply terminal is electrically connected to the fourth DC power supply terminal.

15. A driving method of the shift register unit according to claim 1, comprising:

a charging phase: the first clock signal terminal outputting the first clock signal, the input signal terminal outputting the input signal, and the input circuit outputting, under control of the first clock signal, the input signal to the pull-up node;

an output phase: the second clock signal terminal outputting the second clock signal, the first DC power supply terminal outputting the first power supply signal, the pull-up node maintaining the electric potential of the input signal, and the output circuit outputting, under control of the electric potential of the pull-up node, the second clock signal to the second driving signal output terminal and outputting, under control of the electric potential of the pull-up node, the first power supply signal to the first driving signal output terminal; and a noise reduction phase: the third clock signal terminal outputting the third clock signal, the second DC power supply terminal outputting the second power supply signal, the pull-down control circuit outputting, under control of the third clock signal, the second power supply signal to the pull-down node, and the pull-down circuit outputting, under control of the electric potential of the pull-down node, the third power supply signal of the third DC power supply terminal to the pull-up node, and outputting, under control of the electric potential of the pull-down node, the fourth power supply signal of the fourth DC power supply terminal to the second driving signal output terminal and the first driving signal output terminal respectively.

16. The driving method according to claim 15, the output circuit comprising a first transistor, a second transistor and a capacitor, wherein during the output phase, the second clock signal is at a first electric potential, the capacitor controls the electric potential of the pull-up node and drives the first transistor and the second transistor to be turned on, the second clock signal terminal outputs the second clock signal to the second driving signal output terminal, and the first DC power supply terminal outputs the first power supply signal to the first driving signal output terminal.

17. The driving method according to claim 16, wherein the transistors are N-type transistors, both the first power supply signal and the second power supply signal are at the first electric potential, and both the third power supply signal and the fourth power supply signal are at a second electric potential;

the first clock signal is at the first electric potential during the charging phase and is at the second electric potential during the output phase and the noise reduction phase;

the second clock signal is at the first electric potential during the output phase and is at the second electric potential during the charging phase and the noise reduction phase;

the third clock signal is at the first electric potential during the noise reduction phase and is at the second electric potential during the output phase and the charging phase; and the first electric potential is a high electric potential relative to the second electric potential.

18. A gate drive circuit, comprising a plurality of cascaded shift register units, wherein each shift register unit of the plurality of cascaded shift register units comprises an input circuit, an output circuit, a pull-down control circuit and a pull-down circuit, and wherein the input circuit is connected to a first clock signal terminal, an input signal terminal and a pull-up node respectively, and the input circuit is configured to control an electric potential of the pull-up node under control of a first clock signal of the first clock signal terminal and an input signal of the input signal terminal;

the output circuit is connected to a first DC power supply terminal, a second clock signal terminal, the pull-up node, a first driving signal output terminal and a second driving signal output terminal respectively, and the output circuit is configured, under control of the electric potential of the pull-up node, to output a first power supply signal of the first DC power supply terminal to the first driving signal output terminal, and output a second clock signal of the second clock signal terminal to the second driving signal output terminal;

the pull-down control circuit is connected to a third clock signal terminal, a second DC power supply terminal, a third DC power supply terminal, a pull-down node and the pull-up node respectively, and the pull-down control circuit is configured to control an electric potential of the pull-down node under control of the electric potential of the pull-up node, a third clock signal of the third clock signal terminal, a second power supply signal of the second DC power supply terminal and a third power supply signal of the third DC power supply terminal; and the pull-down circuit is connected to the pull-down node, the third DC power supply terminal, a fourth DC power supply terminal, the pull-up node, the first driving signal output terminal and the second driving signal output terminal respectively, and the pull-down circuit is configured to control, under control of the electric potential of the pull-down node, electric potentials of the pull-up node, the first driving signal output terminal and the second driving signal output terminal through the third power supply signal and a fourth power supply signal of the fourth DC power supply terminal.

19. The gate drive circuit according to claim 18, wherein the input signal terminal of each shift register unit is connected to the second driving signal output terminal of the previous shift register unit expect the first shift register unit.

20. A display device, comprising a gate drive circuit, wherein the gate drive circuit comprises a plurality of cascaded shift register units, each shift register unit of the plurality of cascaded shift register units comprises an input circuit, an output circuit, a pull-down control circuit and a pull-down circuit, and wherein the input circuit is connected to a first clock signal terminal, an input signal terminal and a pull-up node respectively, and the input circuit is configured to control an electric potential of the pull-up node under control of a first clock signal of the first clock signal terminal and an input signal of the input signal terminal;

the output circuit is connected to a first DC power supply terminal, a second clock signal terminal, the pull-up node, a first driving signal output terminal and a second driving signal output terminal respectively, and the output circuit is configured, under control of the electric potential of the pull-up node, to output a first power supply signal of the first DC power supply terminal to the first driving signal output terminal, and output a second clock signal of the second clock signal terminal to the second driving signal output terminal;

the pull-down control circuit is connected to a third clock signal terminal, a second DC power supply terminal, a third DC power supply terminal, a pull-down node and the pull-up node respectively, and the pull-down control circuit is configured to control an electric potential of the pull-down node under control of the electric potential of the pull-up node, a third clock signal of the third clock signal terminal, a second power supply signal of the second DC power supply terminal and a third power supply signal of the third DC power supply terminal; and the pull-down circuit is connected to the pull-down node, the third DC power supply terminal, a fourth DC power supply terminal, the pull-up node, the first driving signal output terminal and the second driving signal output terminal respectively, and the pull-down circuit is configured to control, under control of the electric potential of the pull-down node, electric potentials of the pull-up node, the first driving signal output terminal and the second driving signal output terminal through the third power supply signal and a fourth power supply signal of the fourth DC power supply terminal.

* * * * *